United States Patent
Nagle et al.

(10) Patent No.: US 6,236,670 B1
(45) Date of Patent: May 22, 2001

(54) LASER COMPRISING STACKED LASER DIODES PRODUCED BY EPITAXIAL GROWTH INSERTED BETWEEN TWO BRAGG MIRRORS

(75) Inventors: Julien Nagle, Palaiseau; Emmanuel Rosencher, Bagneux, both of (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/147,312
(22) PCT Filed: Mar. 24, 1998
(86) PCT No.: PCT/FR98/00589
§ 371 Date: Nov. 25, 1998
§ 102(e) Date: Nov. 25, 1998
(87) PCT Pub. No.: WO98/44603
PCT Pub. Date: Oct. 8, 1998

(30) Foreign Application Priority Data

Apr. 1, 1997 (FR) .................................... 97 03935

(51) Int. Cl.⁷ ........................................ H01S 5/00
(52) U.S. Cl. ................... 372/50; 372/45; 372/96
(58) Field of Search .................. 372/45, 50, 96

(56) References Cited

U.S. PATENT DOCUMENTS

| | | | |
|---|---|---|---|
| 5,081,634 | 1/1992 | Weisbuch et al. | 372/45 |
| 5,086,327 | 2/1992 | Rosencher et al. | 257/21 |
| 5,212,706 * | 5/1993 | Jain | 372/50 |
| 5,228,777 | 7/1993 | Rosencher et al. | 374/32 |
| 5,311,221 | 5/1994 | Vodjdani et al. | 359/130 |
| 5,311,278 | 5/1994 | Rosencher et al. | 356/326 |
| 5,326,984 | 7/1994 | Rosencher et al. | 257/21 |
| 5,506,418 | 4/1996 | Bois et al. | 257/15 |
| 5,726,500 | 3/1998 | Duboz et al. | 257/777 |
| 5,739,949 | 4/1998 | Rosencher et al. | 359/332 |
| 5,869,844 | 2/1999 | Rosencher et al. | 257/21 |

FOREIGN PATENT DOCUMENTS

| | | |
|---|---|---|
| 580104 * | 1/1994 | (EP) . |
| 95-07566 * | 3/1995 | (WO) . |

OTHER PUBLICATIONS

Dupuis et al, "Room–Temperature Operation of Distributed–Bragg–Confinement Ga1–xAlxAs–GaAs Lasers Grown by Metalorganic Chemical Vapor Deposition," Appl. Phys. Lett., vol. 33, No. 1, pp. 68–69, Jul. 1978.*

Kotaki et al, "GaInAsP/InP Surface Emitting Laser with Two Active Layers," International Conference on Solid State Devices and Materials, 1984, Tokyo, Japan, pp. 133–136, (no month available), Jan. 1984.*

* cited by examiner

Primary Examiner—Teresa M. Arroyo
Assistant Examiner—Davienne Menbleau
(74) Attorney, Agent, or Firm—Oblon, Spivak, McClelland, Maier & Neustadt, P.C.

(57) ABSTRACT

A laser made of a stack of laser diodes. The stack is inserted between two mirrors to create a laser cavity. The stack of diodes is produced by epitaxial growth of a set of semiconductor layers. The ohmic contact between two adjacent laser diodes is provided by an Esaki diode junction. The optical field of the mode created in the laser cavity is periodically cancelled at the Esaki diode junctions so as to create structures with small dimensions.

7 Claims, 7 Drawing Sheets

FIG. 4a $V = V_{THRESHOLD}$

LASER COMPRISING STACKED LASER DIODES PRODUCED BY EPITAXIAL GROWTH INSERTED BETWEEN TWO BRAGG MIRRORS

BACKGROUND OF THE INVENTION

1. Field of the Invention

The field of the invention is that of lasers comprising a stack of semiconductor lasers making it possible to achieve powers of the order of several kilowatts.

DISCUSSION OF THE BACKGROUND

According to the prior art, lasers of this type comprise laser diodes produced by epitaxial growth, on a semiconductor substrate $C_n$ doped with impurities of a certain type (generally of the n type), of a quantum-well emissive structure PQ then a layer $C_p$ doped with impurities of the opposite type (generally of the p type).

Figure 1:
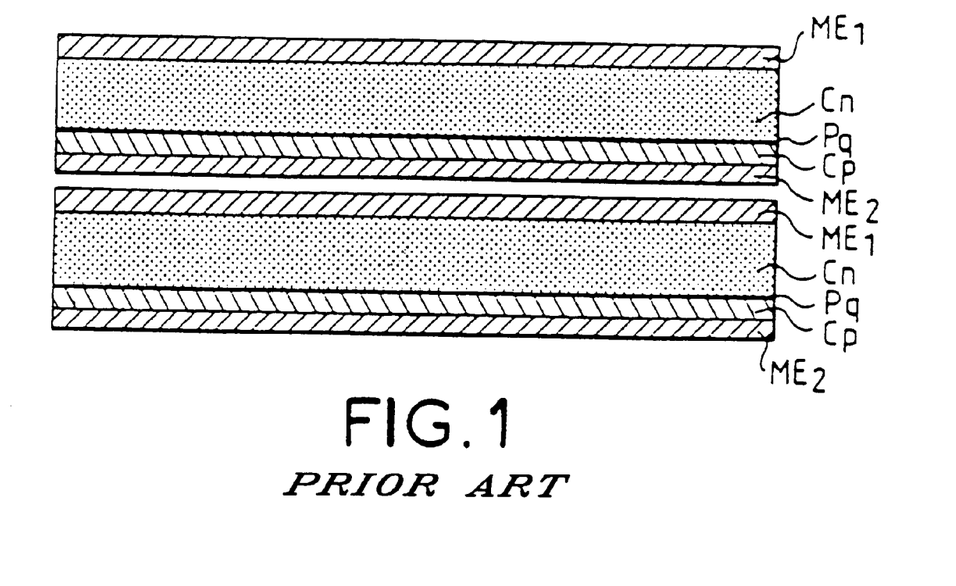
FIG. 1 illustrates a stack of laser diodes according to the prior art.

FIG. 1 illustrates a stack according to the prior art of two laser diodes: metal contacts $ME_1$ and $ME_2$ are deposited on either side of the laser diodes, and the laser diodes are stacked, layer $C_n$ on layer $C^p$, via the metal contacts $ME_1$ and $ME_2$.

Figure 2:
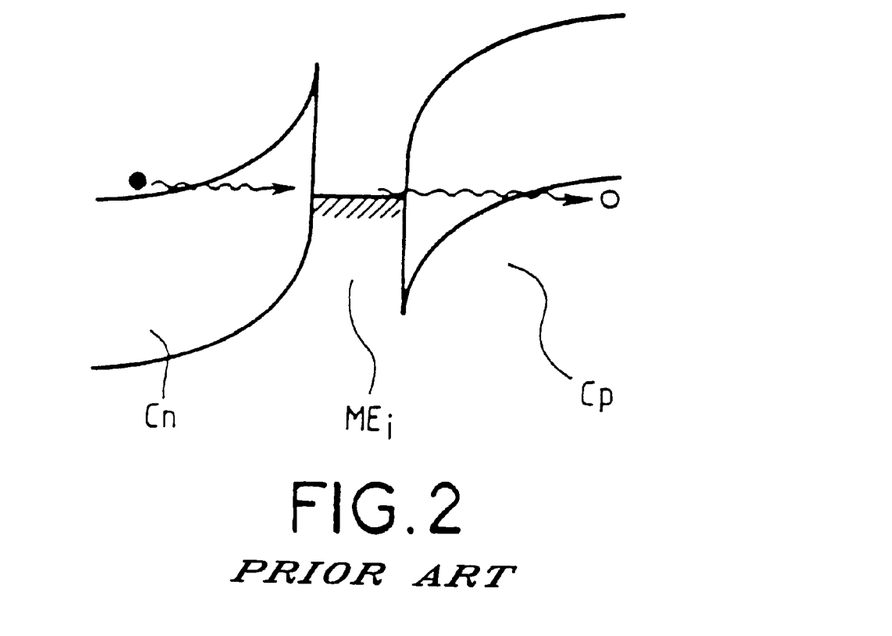
FIG. 2 represents the energy band diagram of the layers $C_n$, $ME_i$ and $C_p$ which are used in a stack of laser diodes according to the prior art.

Generally, metal mechanical jaws enclose the set of diodes in order to dissipate the heat due to the strong thermal effects which take place in each laser diode. The diodes are electrically connected by soldering between a metallization $ME_1$ and a metallization $ME_2$. The electrons pass by the tunnel effect through the Schottky junction corresponding to the interface of a layer $C_n$ and a metallization $ME_1$ while the holes can pass by the tunnel effect through the Schottky junction corresponding to the interface between the layer $C_p$ and the metallization $ME_2$. This is illustrated in FIG. 2, which represents a diagram of the energy bands of the layers $C_n$, $ME_i$ and $C_p$ which are used in a stack of laser diodes according to the prior art.

The quantum-well emissive structures are spaced apart by at least the thickness of a substrate layer (typically a layer $C_n$ represented in FIG. 1), that is to say by several hundreds of microns. In this configuration, the diodes have to be driven by pulses which are short enough for the diffusion lengths of the temperature gradients Ld not to overlap, in order to avoid excessive local temperature rises, the length Ld being given by the following equation (1):

$$Ld = \left(\frac{k\tau}{\rho K_p}\right)^{1/2}$$

with k: thermal conductivity
τ: pulse length
ρ: semiconductor density
$K_p$: semiconductor heat capacity.

For substrates about 400 μm thick, lengths Ld of the order of 200 μm are typically obtained for pulse lengths of the order of 70 to 100 microseconds.

These configurations for stacked laser diodes have the drawback that they require the use of external means for carrying out assembly (in particular soldering), and are of a size which it is difficult to minimize further, because of the thickness of the substrate of each elementary diode.

SUMMARY OF THE INVENTION

In order to solve these problems, the invention proposes a laser structure in which the laser diodes are stacked periodically by epitaxial growth of a set of semiconductor layers, requiring no manual intervention.

More precisely, the invention relates to a laser comprising a stack of N laser diodes $DL_i$, each having a quantum-well emissive structure. $S_i$, characterized in that:

the stack of diodes $DL_i$ is a stack of epitaxial semiconductor layers which is inserted between two mirrors so as to produce a laser cavity;

the ohmic contact between a laser diode $DL_i$ and a laser diode $DL_{i+1}$ is provided by an Esaki diode junction formed of an n-doped layer with a very high doping level and of a p-doped layer with a very high doping;

the optical electric field of the mode created in the laser cavity is periodically cancelled at the Esaki diode junctions.

More precisely, the junctions being of the Esaki diode type, this laser according to the invention may comprise a stack of N laser diodes, characterized in that the stack of epitaxial layers comprises layers $S_i$, n-doped layers $C'_{ni}$, p-doped layers $C'_{pi}$, a layer $C'_{ni}$ being adjacent to a layer $C'_{pi+1}$, the doping level $t'_{ni}$ of the layers $C'_{ni}$ and the doping levels $t'_{pi}$ of the layers $C'_{pi}$ being such that an electron flow is capable of passing by the tunnel effect from a layer $C'_{pi}$ to a layer $C'_{ni+1}$ so as to provide the ohmic contact between a diode $DL_i$ and a diode $DL_{i+1}$.

Since the free carriers, present in very large numbers at the Esaki diode junction, absorb the optical wave which is generated, the invention proposes a laser structure designed so that the optical electric field of the mode is cancelled at the position of the Esaki diode junctions.

This solution is advantageous in so far as it makes it possible to retain laser structures with small dimensions in comparison with a laser structure in which the choice is made to distance the junctions between diodes of the laser emission zone.

According to an alternative embodiment, the stack of diodes $(DL_i)$ is inserted between two plane mirrors which are parallel to the plane of the epitaxial semiconductor layers, so as to create laser emission perpendicular to the plane of the layers.

Advantageously, the mirrors may be Bragg mirrors, one of which has a reflectivity close to 100% for the optical wave which is created, the other Bragg mirror having a lower reflectivity so as to allow the laser emission to emerge.

According to another variant of the invention, the stack of diodes $(DL_i)$ is inserted between two plane mirrors which are perpendicular to the plane of the epitaxial semiconductor layers, so as to create laser emission parallel to the plane of the layers.

The optical wave is confined in the stack of diodes by inserting the set of epitaxial layers between two confinement structures or layers.

These confinement structures may in particular consist of Bragg mirrors having close to 100% reflectivity for the optical wave created in the laser cavity.

BRIEF DESCRIPTION OF THE DRAWINGS

The invention will be understood more clearly, and other advantages will emerge, on reading the following description which is given by way of nonlimiting example and by virtue of the appended figures, in which.

DETAILED DESCRIPTION OF THE PREFERRED EMBODIMENT

According to the invention, the laser structure comprises a set of semiconductor layers grown epitaxially so as to produce a stack of laser diodes, two adjoining laser diodes being electrically connected by means of Esaki diode junctions, such a junction being formed by a very heavily p-doped region and a very heavily n-doped region. It is actually known, as explained for example in the book by S. M. Sze, Physics of Semiconductor Devices, John Wiley (New York, 1983) that such a junction when reverse-biased (as is the case in the stacked structure of the invention) allows electrons to pass from the valence band on the heavily p-doped side to the conduction band on the heavily n-doped side.

Figure 3:
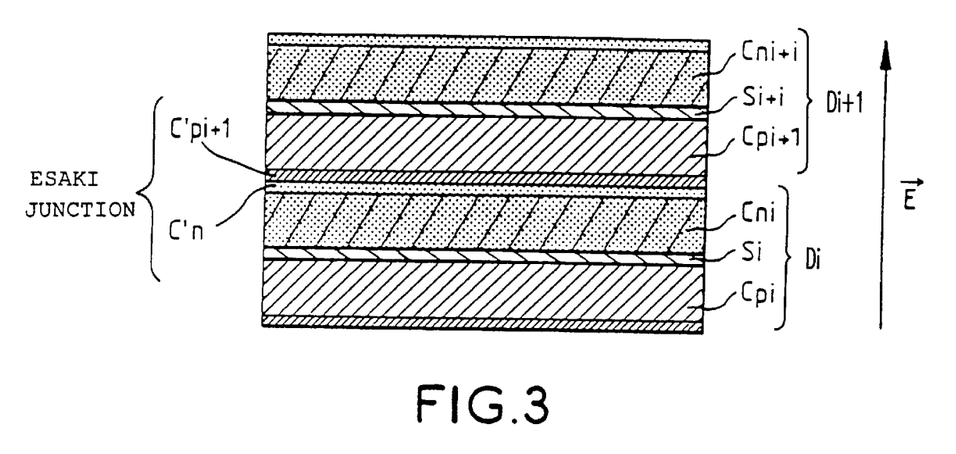
FIG. 3 illustrates an example of a laser diode stack according to the invention, using Esaki junction.

The emissive structure $S_i$ of each laser diode may be contained between two optical confinement layers with a lower index, one of the layers $C_{ni}$ being n-doped, the other layer $C_{pi}$ being p-doped. FIG. 3 shows the way in which a laser diode $D_{i+1}$ is stacked on a laser diode $D_i$ by means of the heavily doped layers $C'_{ni}$ and $C'_{pi+1}$. The electric field vector $\overline{E}$ indicates the electrical bias direction to be applied during operation in order to allow electron-hole recombinations at the emissive structures $S_i$.

Figure 4A:
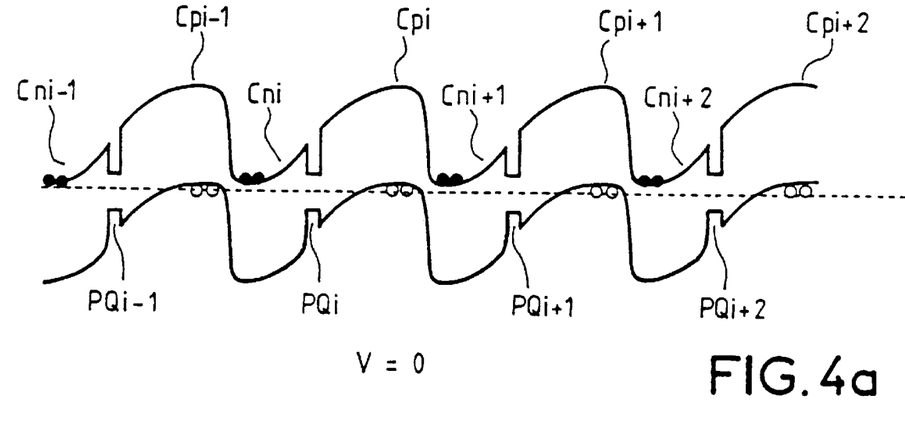
FIG. 4a illustrates the energy band diagram of the stack of laser diodes which are used in a laser according to the invention, comprising Esaki junctions in the absence of voltage.

FIG. 4a illustrates the energy band diagram of the set of semiconductor layers allowing creation of the stack of laser diodes according to the invention, without an applied voltage.

Figure 4B:
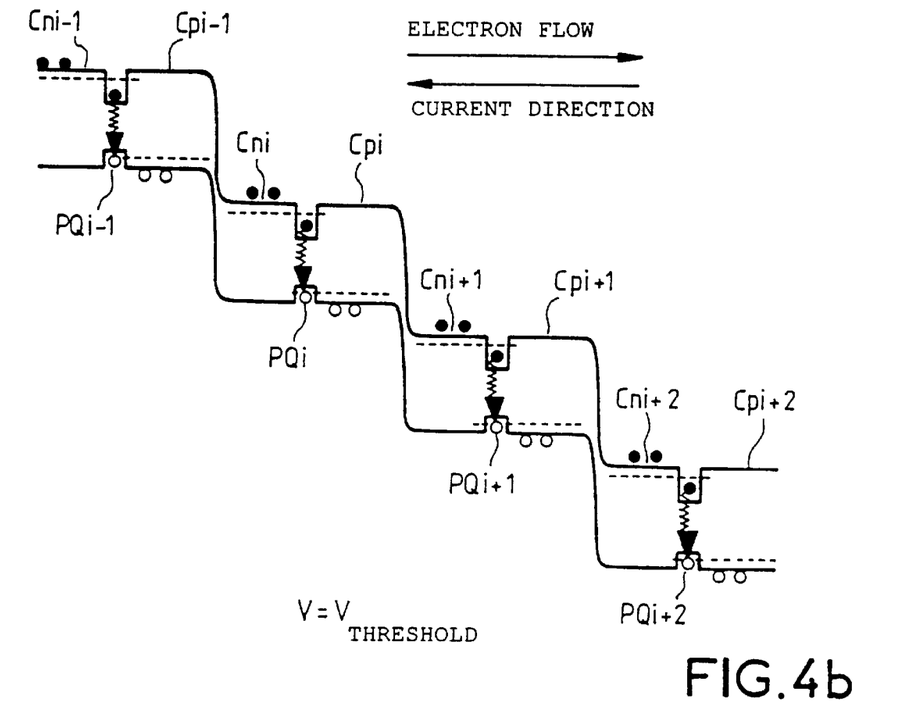
FIG. 4b illustrates the energy band diagram of the stack of laser diodes which are used in a laser according to the invention, comprising Esaki junctions in the presence of an applied voltage.

FIG. 4b illustrates the energy band diagram of the set of semiconductor layers allowing creation of the stack of laser diodes according to the invention, with an applied voltage.

Several quantum-well structures have been represented in order to demonstrate the movement of electrons at each junction. Four laser diodes are thus illustrated here by a succession of layers $C_{ni}$, quantum-well structures $PQ_i$ and layers $C_{pi}$.

FIG. 4a shows the energy band diagrams of such a structure. At zero voltage, the junctions which are in series have periodic potential barriers. Under a forward-bias voltage applied to the overall structure, the Esaki junctions are all reverse-biased. As indicated by FIG. 4b, for a high enough voltage, the system assumes a flat band configuration. Once in flat bands (with small potential drops at the junctions), the structure allows the current to flow and the layers start to lase. The operating principle can be interpreted in the following way: once it has made an optical transition at the junction $S_i$, the electron is injected from the region $C_{pi}$ to the region $C_{ni+1}$ by the Esaki junction $C_{pi}/C_{ni+1}$. It will be noted that the Esaki diode can be produced in a semiconductor having a smaller gap than the substrate, in order to reduce the contact resistance of the diode, by using an InGaAs alloy on GaAs, for example.

According to a first variant, the stack of diodes is inserted between two plane mirrors which are perpendicular to the plane of layers. A first mirror has close to 100% reflectivity, and the other mirror has lower reflectivity.

Figure 5:
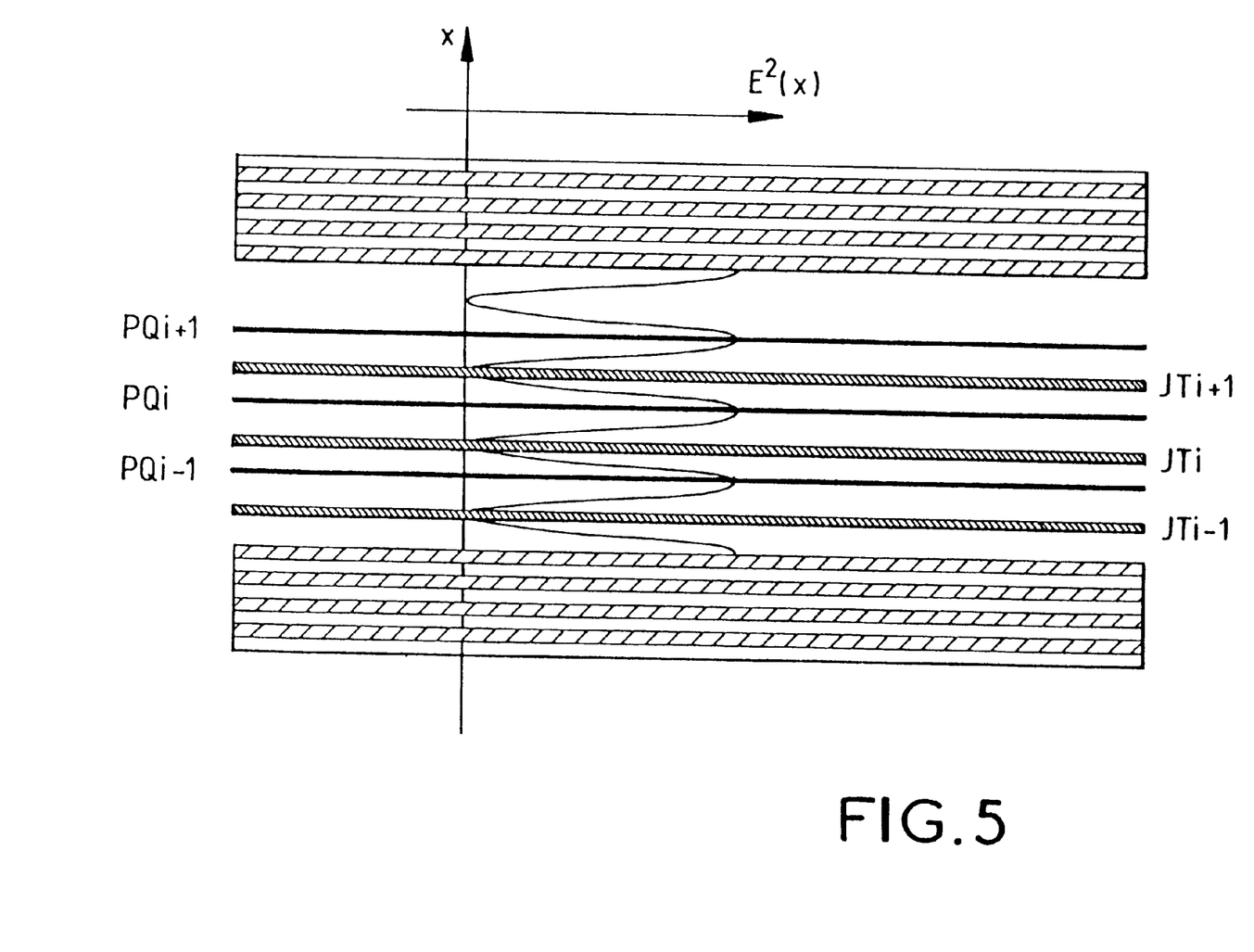
FIG. 5 illustrates an example of a laser according to the invention, comprising two maximum-reflection Bragg mirrors and Esaki diodes, and emitting in a plane parallel to the plane of the diodes.

In order to cancel the optical electric field of the mode which is created at the Esaki junctions, the stack of diodes may advantageously be integrated between two series of Bragg mirrors which are parallel to the plane of the layers, having close to 100% reflectivity. The structure constitutes a guide such that the guided mode has a zero electric field at the Esaki junctions $JT_i$, the laser beam being emitted parallel to the layers (see FIG. 5), with $E(x)$ representing the electric field of the optical wave in the laser cavity. By way of example, for 10 stages, the total thickness would then be 10 times the halfwavelength divided by the optical index, that is to say of the order of 2 $\mu$m.

Figure 6:
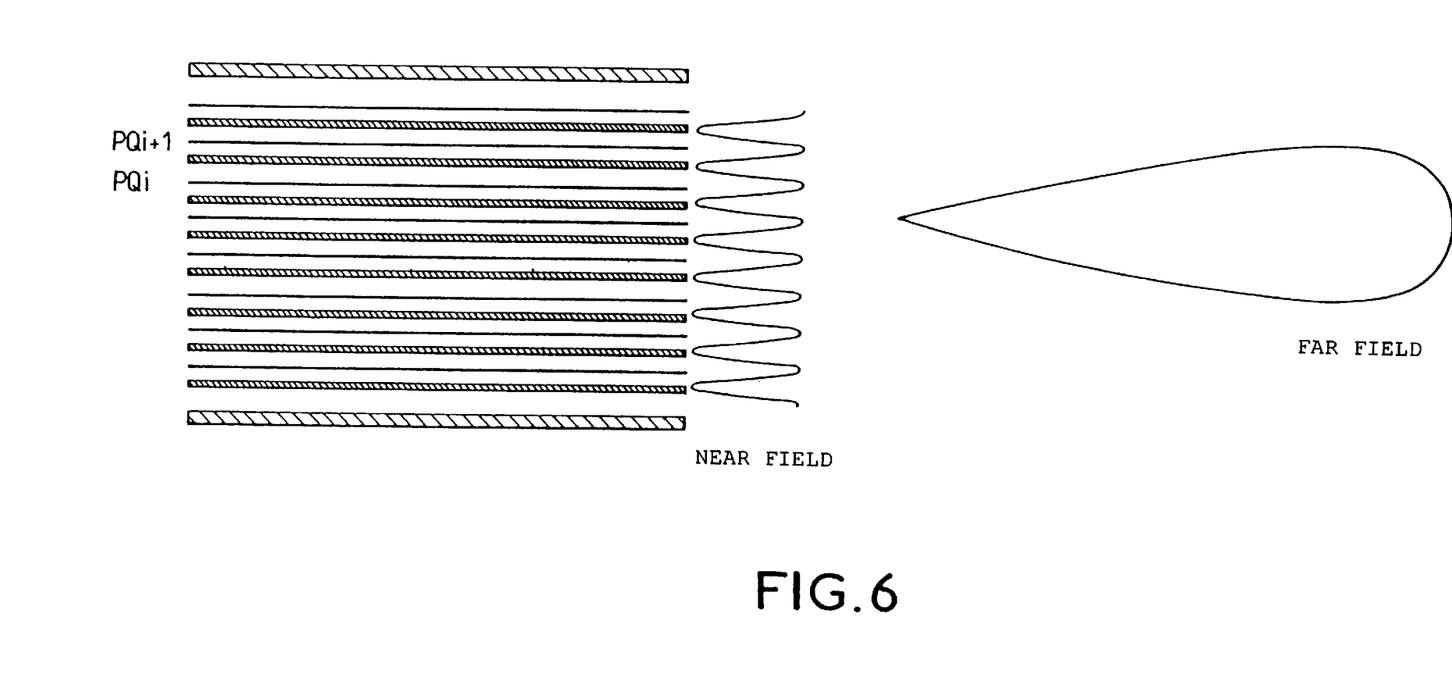
FIG. 6 illustrates the optical field created by the laser according to the invention, close to the laser (near field) and far from the laser (far field)

In this configuration, the laser layers are very strongly coupled to one another, and their emissions can naturally be set in phase. This provides a vertical array of lasers in phase, which is extremely difficult to obtain in a horizontal geometry. It is known that these arrays can emit beams whose divergence is much less than in a single laser (A. Yariv, Quantum Electronics, Wiley Interscience). In this regard, FIG. 6 illustrates the extent of the "near" optical field of the laser and the extent of the "far" optical field.

We will now provide an illustrative embodiment. The substrate is heavily n+-doped GaAs (typically $10^{18}$ cm$^{-3}$). An n+ GaAs buffer layer is produced according to the rules of the art then the component is formed by a stack of the following elementary structures: a strongly p-doped AlGaAs barrier followed by a GaAs layer doped n++ (a few $10^{19}$ cm$^{-3}$) then doped p++. Each elementary layer has a thickness of 1 $\mu$m. The n++/p++ contact resistance is typically $10^{-4}$ ohm.cm$^{-2}$. Since the laser currents are of the order of 15 kA/cm$^2$, there is a 100 millivolt potential drop at each Esaki junction. This potential drop can be reduced by using an In$_{0.2}$Ga$_{0.8}$As Esaki diode which, by virtue of the gap reduction in comparison with that of GaAs, leads to a 30 mV voltage drop.

According to another variant of the invention, the laser emission is obtained perpendicular to the plane of the diodes, and for this the stack of diodes may be integrated between two Bragg mirrors, one of which is slightly transparent, the plane of the said mirrors being parallel to the plane of the diodes.

Figure 7:
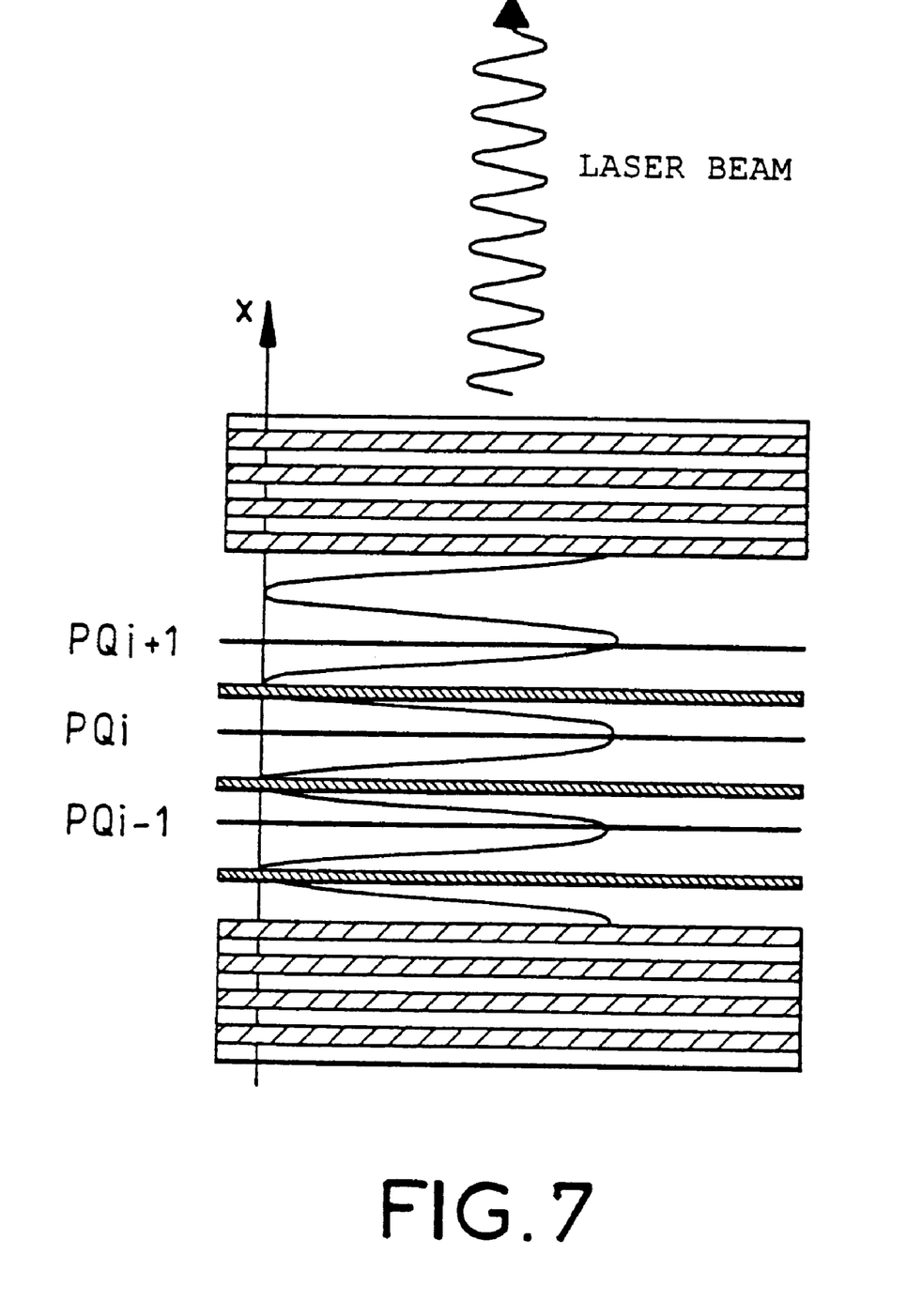
FIG. 7 illustrates an example of a laser according to the invention with surface emission, using a partially transparent Bragg mirror.

The structure is produced in the form of a mesa with small dimensions. The laser emission then takes place through the surface, and the system is therefore of the VCSEL type (Vertical Cavity Surface Emission Laser) (see FIG. 7). Let us note that, in this case, the two Bragg mirrors may be n-doped, which considerably reduces the access resistances and greatly facilitates the VCSEL production process.

The stacks of epitaxial laser diodes according to the invention have different thermal behavior from the stacked laser diodes according to the prior art:

In spite of the increased proximity of the emissive structures to one another, and of the maximum heating zones, the structures according to the invention are capable of dissipating the heat satisfactorily.

In conventional structures using a plurality of diodes which are prefabricated then stacked, the temperature decreases linearly in each layer over a distance given by equation (1) which was defined above (typically over a distance of 200 μm for a length of time of 100 μs).

In the epitaxial structure according to the invention, the temperature may be assumed to be uniform over the entire thickness of each laser diode after a very short time, because of the short distances separating two emissive regions $S_i$. The metal bases constitute heat reservoirs.

It may thus be considered that the active structure is placed between two heat reservoirs at a relative temperature T=0 and that during a current pulse the heat power dissipated is distributed uniformly throughout the active structure.

If x corresponds to the distance from the center of the structure in the direction of a heat reservoir, the temperature field T (x, t) as a function of this distance and of time is then determined by the diffusion equation (2):

$$\partial T/\partial t = D \partial^2 T/\partial x^2 = P/\rho c_p L$$

with D: thermal diffusion constant

P: heat power divided by the laser cross section

L: overall laser thickness corresponding to the epitaxial structure.

The boundary conditions for this equation (2) are:

$$T(-L/2,t)=T(L/2,t)=0$$

and $T(x,0)=0$

By redimensioning with L as the length unit, $L^2/D$ as the time unit and $PL/\rho C_p D$ (or alternatively PL/K, K being the thermal conductivity) as the temperature unit, the following equation (3) is also obtained:

$$\partial T'/\partial t' = \partial^2 T'/\partial x'^2 + 1$$

The steady-state solution to equation 3 is the following equation (4):

$$T'\infty(x')=\tfrac{1}{8}-x'^2/2$$

and the maximum steady temperature is therefore $T_{max}$=PL/8K.

Figure 8:
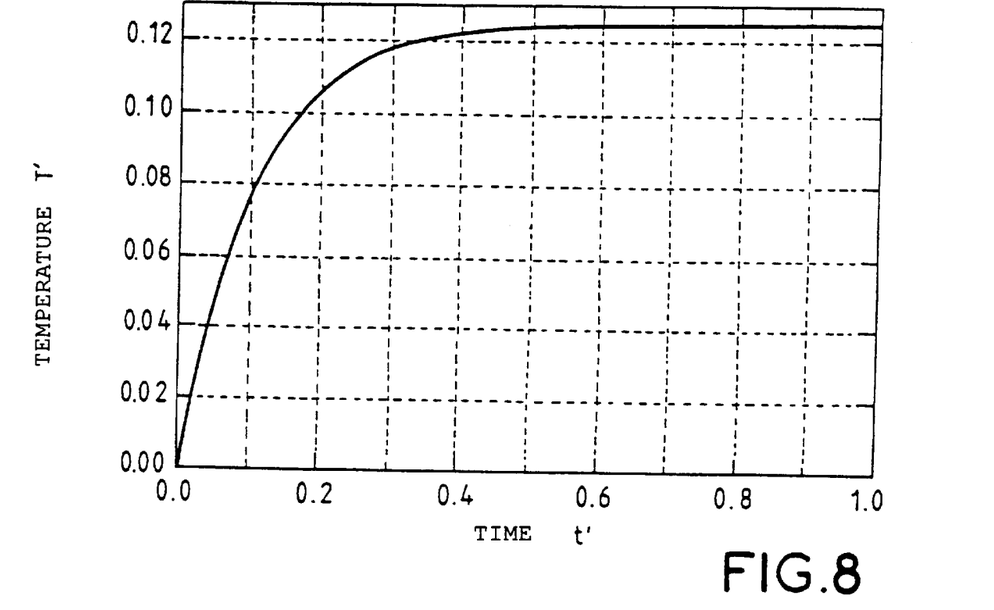
FIG. 8 illustrates the variation in the temperature of a laser according to the invention, at the centre of the said laser, as a function of time during a pulse.

In this regard, FIG. 8 illustrates the results of the variation of the curve T' (0, t) at the center of the structure. Two ranges are clearly demonstrated: for small t', the temperature rises linearly, indicating that the heat is by no means dissipated to the reservoirs, and for larger t', the temperature stabilizes at the steady-state value, indicating that the heat is continuously dissipated.

These principles can be applied in the specific case of a laser structure according to the invention based on GaAs. Taking into account the permissible temperature rise $T_0$ and a given laser thickness L, it is possible on the basis of a curve such as the one represented in FIG. 6 to determine the maximum pulse lengths which the laser structure can tolerate on the basis of imposed parameters such as the permissible temperature rise.

Figure 9:
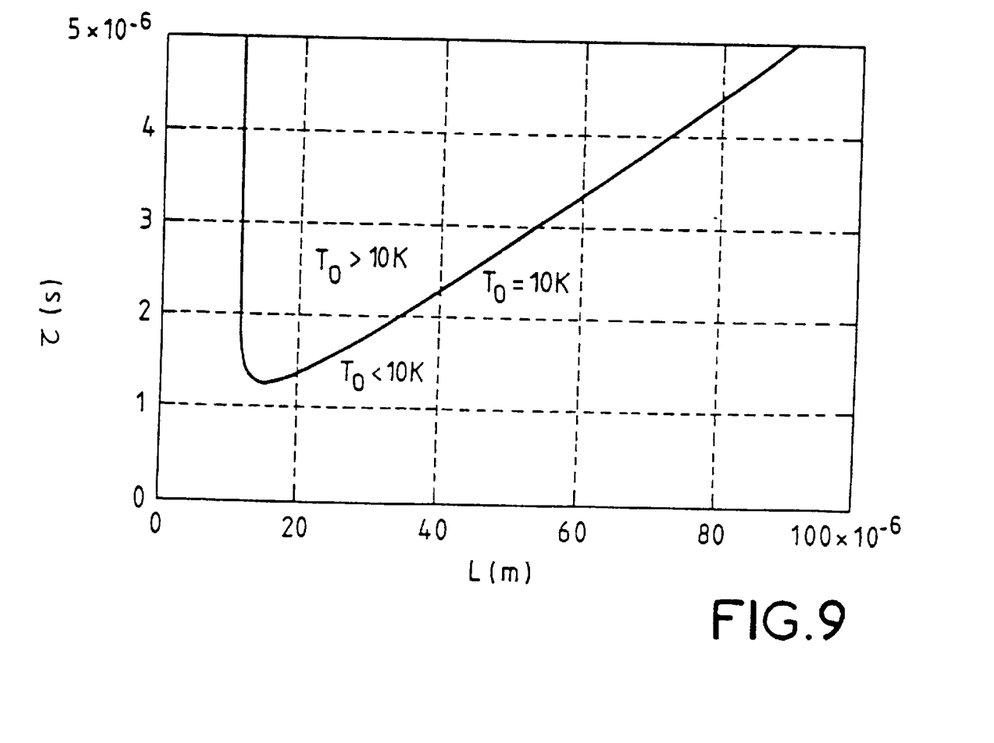
FIG. 9 illustrates the maximum pulse length permitted as a function of the thickness of a laser structure according to the invention, for an allowed temperature difference To=10 K.

An example is illustrated in FIG. 9, the constants of the GaAs material being as follows:

$D=2.5\times10^{-5} m^2/s$ $K=46\ W\ m^{-1}\times K^{-1}$ $P=2\ kW/0.06\times10^{-6} m^2$ $T_0=10K$ The curve of FIG. 9 gives the maximum pulse length τ in seconds as a function of the thickness L of the laser, expressed in metres. The curve illustrated in this figure relates to a temperature $T_0$=10 K.

What is claimed is:

1. A laser comprising:

a stack of laser diodes disposed between two Bragg mirrors with a maximum reflectivity close to 100% so as to create a waveguide; and an Esaki junction disposed between adjacent laser diodes in the stack of laser diodes so as to provide an ohmic contact between the adjacent laser diodes, wherein an optical electrical field of a mode created in the waveguide is periodically canceled at the Esaki junction.

2. The laser according to claim 1, wherein each laser diode in the stack of laser diodes comprises a quantum-well emissive structure.

3. The laser according to claim 1, wherein each laser diode in the stack of laser diodes comprises a stack of epitaxial semiconductor layers.

4. The laser according to claim 3, wherein a plane of the two Bragg mirrors is parallel to a plane of the semiconductor layers so as to produce laser emission in the plane of the semiconductor layers.

5. The laser according to claim 3, wherein each laser diode comprises an emissive structure contained between an n-doped layer and a p-doped layer.

6. The laser according to claim 3, wherein the Esaki junction comprises a heavily p-doped layer adjacent to a heavily n-doped layer and in which doping levels of the heavily p-doped and n-doped layers are such that an electron flow passes by a tunnel effect from a p-doped layer of a first laser diode to a n-doped layer of a second laser diode adjacent to the first laser diode so as to provide the ohmic contact between the first and second laser diodes.

7. A The laser according to claim 6, wherein the n-doped and p-doped layers of the laser diode comprise AlGaAs, the emissive structure comprises GaAs, and the heavily p-doped and n-doped layers of the Esaki junction comprise $I_{n-1}Ga_xAs$.

* * * * *